United States Patent
Chung et al.

(10) Patent No.: US 10,302,818 B2
(45) Date of Patent: May 28, 2019

(54) PHOTONIC CRYSTAL STRUCTURE, METHOD OF MANUFACTURING THE PHOTONIC CRYSTAL STRUCTURE, REFLECTIVE COLOR FILTER, AND DISPLAY APPARATUS EMPLOYING THE PHOTONIC CRYSTAL STRUCTURE

(71) Applicant: Samsung Electronics Co., Ltd., Suwon-si, Gyeonggi-do (KR)

(72) Inventors: Deuk-seok Chung, Yongin-si (KR); Byong-gwon Song, Seoul (KR); Joon-won Bae, Seoul (KR); Young-jun Yun, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 36 days.

(21) Appl. No.: 15/188,398

(22) Filed: Jun. 21, 2016

(65) Prior Publication Data
US 2016/0299258 A1    Oct. 13, 2016

Related U.S. Application Data

(62) Division of application No. 13/563,927, filed on Aug. 1, 2012, now abandoned.

(30) Foreign Application Priority Data

Sep. 9, 2011    (KR) .................. 10-2011-0092226

(51) Int. Cl.
*G02B 5/28* (2006.01)
*G02B 1/00* (2006.01)
(Continued)

(52) U.S. Cl.
CPC .............. *G02B 1/005* (2013.01); *B82Y 30/00* (2013.01); *B82Y 40/00* (2013.01);
(Continued)

(58) Field of Classification Search
CPC ........ G02B 5/285; G02B 5/0833; C04B 41/52
(Continued)

(56) References Cited

U.S. PATENT DOCUMENTS

| 5,729,313 A | 3/1998 | Mitsui |
| 6,184,956 B1 * | 2/2001 | Kang .................. G02B 5/0808 349/113 |

(Continued)

FOREIGN PATENT DOCUMENTS

| EP | 1571467 A2 | 9/2005 |
| EP | 1610170 A1 | 12/2005 |

(Continued)

OTHER PUBLICATIONS

Japanese Office Action dated Nov. 8, 2016 issued in corresponding Japanese Patent Application No. 2012-193474 (English translation provided).

(Continued)

*Primary Examiner* — Audrey Y Chang
(74) *Attorney, Agent, or Firm* — Harness, Dickey & Pierce, P.L.C.

(57) ABSTRACT

A photonic crystal structure includes a nano structure layer including a plurality of nano particles of various sizes, and a photonic crystal layer on the nano structure layer. The plurality of nano particles are spaced apart from each other. The photonic crystal layer has a non-planar surface, and is configured to reflect light of a particular wavelength.

7 Claims, 7 Drawing Sheets

(51) Int. Cl.
| | |
|---|---|
| *G02B 5/02* | (2006.01) |
| *G02B 5/20* | (2006.01) |
| *B82Y 30/00* | (2011.01) |
| *B82Y 40/00* | (2011.01) |
| *C23C 14/06* | (2006.01) |
| *C23C 14/08* | (2006.01) |
| *C23C 14/10* | (2006.01) |
| *C23C 14/34* | (2006.01) |

(52) U.S. Cl.
CPC ...... *C23C 14/0652* (2013.01); *C23C 14/0694* (2013.01); *C23C 14/081* (2013.01); *C23C 14/083* (2013.01); *C23C 14/087* (2013.01); *C23C 14/10* (2013.01); *C23C 14/34* (2013.01); *G02B 5/0221* (2013.01); *G02B 5/0284* (2013.01); *G02B 5/0294* (2013.01); *G02B 5/201* (2013.01); *G02B 5/285* (2013.01)

(58) Field of Classification Search
USPC .......................... 359/584; 427/162, 203, 299
See application file for complete search history.

(56) References Cited

U.S. PATENT DOCUMENTS

| | | | | |
|---|---|---|---|---|
| 6,187,457 | B1* | 2/2001 | Arai | H01L 51/5231 257/100 |
| 7,397,558 | B2* | 7/2008 | Kamins | G01N 21/658 356/301 |
| 7,440,050 | B2 | 10/2008 | Sumi | |
| 8,322,869 | B2 | 12/2012 | Wakizaka et al. | |
| 2002/0135714 | A1 | 9/2002 | Tatsuta et al. | |
| 2003/0218704 | A1 | 11/2003 | Lee et al. | |
| 2009/0174849 | A1 | 7/2009 | Takano et al. | |
| 2009/0284696 | A1 | 11/2009 | Cheong et al. | |
| 2010/0177393 | A1* | 7/2010 | Lee | B29D 11/00596 359/584 |

FOREIGN PATENT DOCUMENTS

| | | |
|---|---|---|
| EP | 1732139 A1 | 12/2006 |
| JP | 07-253509 A | 10/1995 |
| JP | 11-326900 A | 11/1999 |
| JP | 2003-98340 A | 4/2003 |
| JP | 2007-87523 A | 4/2007 |
| JP | 2007-225935 A | 9/2007 |
| JP | 2009-276766 A | 11/2009 |
| JP | 2010-138304 A | 6/2010 |
| KR | 2010-0083384 A | 7/2010 |
| KR | 2011-0050930 A | 5/2011 |
| KR | 2013-0025721 A | 3/2013 |
| WO | WO-00/28603 A1 | 5/2000 |
| WO | WO-2011/161482 A1 | 12/2011 |

OTHER PUBLICATIONS

European Office Action dated Dec. 9, 2014.
European Examination Report dated Jun. 30, 2015 issued in corresponding European Patent Application No. 12 183 044.2.
Saito, et al. "Reproduction, Mass-production, and Control of the Morpho-butterfly's Blue", Advanced Fabrication Technologies for Micro/Nano Optics and Photonics II, vol. 7205, No. 720506, pp. 7205 720506-1-7205 720506-9, (2009).
Japanese Office Action dated Feb. 23, 2016 issued in corresponding Japanese Application No. 2012-193474 (English translation provided).
Extended European Search Report dated Jun. 11, 2013 issued in European Application No. 12183044.2.
S. Wu, et al. "Design of Reflective Color LCD Using Optical Interference Reflectors," Asia Display, XP002148248 (1995).

\* cited by examiner

PHOTONIC CRYSTAL STRUCTURE, METHOD OF MANUFACTURING THE PHOTONIC CRYSTAL STRUCTURE, REFLECTIVE COLOR FILTER, AND DISPLAY APPARATUS EMPLOYING THE PHOTONIC CRYSTAL STRUCTURE

CROSS-REFERENCE TO RELATED APPLICATIONS

This application is a divisional of U.S. application Ser. No. 13/563,927, filed on Aug. 1, 2012, which claims the benefit of Korean Patent Application No. 11-2011-0092226, filed on Sep. 9, 2011, in the Korean Intellectual Property Office, the entire contents of each of which are incorporated herein by reference.

BACKGROUND

1. Field

Some example embodiments relate to photonic crystal structures, methods of manufacturing photonic crystal structures, reflective color filters and display apparatuses employing photonic crystal structures.

2. Description of the Related Art

Photonic crystal is a material having a crystal structure used to control light. A crystal structure in which a refractive index is repeated in a period results in occurrences of a constructive interference from light of a specific wavelength and a destructive interference from light of other wavelengths, thus forming a specific color. In this way, structural color technology that forms a color by reflecting and interfering light advantageously forms a color of higher efficiency and controls chromaticity more easily compared with technology that forms a color by absorbing light.

In one-dimensional photonic crystals that are most easily fabricated generally, transparent insulating layers of a lower refractive index and a higher refractive index are alternately deposited to control a color of reflected light. However, in one-dimensional photonic crystals, designed colors are formed only with respect to light having a perpendicular incident angle, and colors are shifted to shorter wavelength bands according to Bragg's law as an incident angle becomes smaller. One-dimensional photonic crystals have viewing angles of 5 or less degrees, and thus, applying one-dimensional photonic crystals to devices such as displays is difficult although one-dimensional photonic crystals have higher color formation and reflection characteristics.

SUMMARY

Some example embodiments provide photonic crystal structures exhibiting a color filtering performance of a wide viewing angle, a method of manufacturing photonic crystal structures, reflective color filters and display apparatuses employing photonic crystal structures.

Additional aspects will be set forth in part in the description which follows and, in part, will be apparent from the description, or may be learned by practice of example embodiments.

According to an example embodiment, a photonic crystal structure includes a nano structure layer including a plurality of nano particles of various sizes, the plurality of nano particles spaced apart from each other, and a photonic crystal layer on the nano structure layer, the photonic crystal layer having a non-planar surface and configured to reflect light having a particular wavelength.

The nano structure layer may have a monolayer structure of the plurality of nano particles. The photonic crystal layer may include a first material layer and a second material layer alternately deposited on the nano structure layer. The first material layer may have a first refractive index and the second material layer may have a second refractive index different from the first refractive index. The first material layer and the second material layer may be formed of transparent insulating materials.

The first material layer and the second material layer may be one of $SiO_2$, $TiO_2$, $Si_3N_4$, $CaF_2$, LiF, and $MgF_2$. One of the first material layer and the second material layer may be formed of an insulating material, and the other one of the first material layer and the second material layer may be formed of a metal material. The plurality of nano particles of the nano structure layer may be one of silica ($SiO_2$), alumina ($Al_2O_3$), titania ($TiO_2$), zirconia ($ZrO_2$), yttria-zirconia ($Y_2O_3$—$ZrO_2$), copper oxide (CuO, $Cu_2O$), and tantalum oxide ($Ta_2O_5$).

According to another example embodiment, a method of manufacturing a photonic crystal structure may include forming a nano structure layer on a substrate, and forming a photonic crystal layer on the nano structure layer. The nano structure layer may include a plurality of nano particles of various sizes spaced apart from each other; and the photonic crystal layer may have a non-planar surface and may be configured to reflect light having a particular wavelength.

Forming the nano structure layer may include forming a plurality of core-shell type particles on the substrate, reflowing materials of shells of the plurality of core-shell type particles using a baking process to expose materials of cores of the plurality of core-shell type particles, and etching the reflowed materials of the shells. The plurality of core-shell type particles may be formed in a monolayer structure. The cores of the plurality of core-shell type particles may be formed of inorganic materials, and the shells of the plurality of core-shell type particles may be formed of organic materials.

Forming the photonic crystal layer may include alternately depositing a first material layer and a second material layer. The first material layer may have a first refractive index and the second material layer may have a second refractive index different from the first refractive index. The first material layer and the second material layer may be alternately deposited by a deposition process using a sputter. Sputter deposition conditions may include a mean of a distance before target particles collide of about 10 cm or more, and a distance between a target and the substrate of about 10 cm or less.

According to another example embodiment, a reflective color filter may include a plurality of first color units, a plurality of second color units, and a plurality of third color units, each of which include the photonic crystal structure. The photonic crystal layer of each of the plurality of first, second and third color units may be configured to reflect light of a first wavelength, a second wavelength, and a third wavelength, respectively. The plurality of first color units, second color units, and third color units may be alternately arranged in a two-dimensional array.

The nano structure layer may have a monolayer structure of the plurality of nano particles. The photonic crystal layer may include a first material layer and a second material layer alternately deposited on the nano structure layer. The first material layer may have a first refractive index and the second material layer may have a second refractive index different from the first refractive index. The first material layer and the second material layer may be formed of transparent insulating materials. The first material layer and the second material layer may be one of $SiO_2$, $TiO_2$, $Si_3N_4$, $CaF_2$, LiF, and $MgF_2$. One of the first material layer and the second material layer may be formed of an insulating material, and the other of the first material layer and the second material layer may be formed of a metal material. The plurality of nano particles of the nano structure layer may be one of silica ($SiO_2$), alumina ($Al_2O_3$), titania ($TiO_2$), zirconia ($ZrO_2$), yttria-zirconia ($Y_2O_3$—$ZrO_2$), copper oxide (CuO, $Cu_2O$), and tantalum oxide ($Ta_2O_5$).

According to another example embodiment, a display apparatus may include the reflective color filter, and a display panel including regions corresponding to the plurality of first color units, the plurality of second color units, and the plurality of third color units, the display panel modulating light incident to the regions according to image information.

The display panel may include one of a liquid crystal display device, an electrophoresis display device, an electrowetting display device, and an electrochromic display device. An absorption unit may correspond with the display panel, and the absorption unit may be configured to absorb light passing through the reflective color filter.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
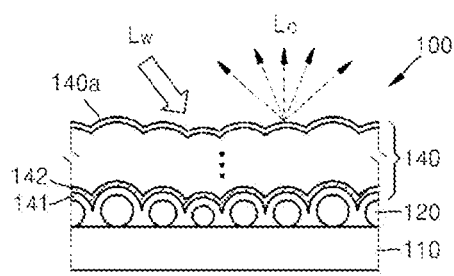
FIG. 1 is a schematic cross-sectional view of a photonic crystal structure according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic cross-sectional view of a photonic crystal structure 100 according to an example embodiment. Referring to FIG. 1, the photonic crystal structure 100 may include a nano structure layer including a plurality of nano particles 120 having various sizes, for example, random sizing. The nano particles 120 are spaced apart from each other by a distance. A photonic crystal layer 140 is formed on the nano structure layer, has a non-planar surface 140a, and is configured to reflect light of a particular (or, alternatively a predetermined) wavelength.

The nano structure layer is provided to allow the determination layer 140 formed on the nano structure layer to have a particular (or, alternatively a predetermined) inclination angle. That is, the photonic crystal layer 140, which has a height distribution that varies, for example, a random height distribution, may be formed by the nano structure layer and thus a color variation, in which a color looks different according to an angle viewed, may be reduced.

A detailed structure of the photonic crystal structure 100 will be provided below. A substrate 110 may be formed of silicon, silicon oxide, sapphire, silicon carbide, glass, or the like.

The nano particles 120 are spaced apart from each other on the substrate 110, and have a various size distribution, for example, random size distribution. Spaces between the nano particles 120 may be properly determined according to the number of layers deposited in the photonic crystal layer 140 and an inclination angle formed by the surface 140a of the photonic crystal layer 140. The spaces between the nano particles 120 may be uniform or may vary, for example, may be random.

The nano particles 120 may be formed of any one selected from the group consisting of silica ($SiO_2$), alumina ($Al_2O_3$), titania ($TiO_2$), zirconia ($ZrO_2$), yttria-zirconia ($Y_2O_3$—$ZrO_2$), copper oxide (CuO, $Cu_2O$), and tantalum oxide ($Ta_2O_5$). The nano particles 120 may form a monolayer. However, the present example embodiment is not limited thereto. The nano particles 120 may have diameters of about several tens of nm to about several hundreds of nm.

The photonic crystal layer 140, which is one-dimensional photonic crystal configured to reflect light of a particular (or, alternatively a predetermined) wavelength, includes a first material layer 141 having a first refractive index and a second material layer 142 having a second refractive index different from the first refractive index, which are alternately deposited. A reflection wavelength bandwidth is determined according to the first and second refractive indices and thicknesses of the first material layer 141 and the second material layer 142. The number of deposited layers is determined according to reflection efficiency. In general, the more the number of deposited layers, the higher the reflection efficiency.

The first material layer 141 and the second material layer 142 may be formed of transparent insulating materials. The first material layer 141 and the second material layer 142 may be formed of any one selected from the group consisting of $SiO_2$, $TiO_2$, $Si_3N_4$, $CaF_2$, LiF, and $MgF_2$.

One of the first material layer 141 and the second material layer 142 may be formed of an insulating material, and the other one may be formed of a metal material. The first material layer 141 or the second material layer 142 that is formed of the metal material may be as thin as possible so that a minimum or small amount of light may be absorbed. For example, the first material layer 141 or the second material layer 142 may have a thickness of about 50 nm or less.

The surface 140a of the photonic crystal layer 140 is not planar and has a height distribution that varies, for example, random height distribution, since the photonic crystal layer 140 is formed on the nano particles 120 having various sizes, for example, random sizes. The higher the number of deposited layers determined according to the reflection efficiency, the smaller the non-planar degree of the surface 140a of the photonic crystal layer 140, for example, the smaller the inclination angle with respect to a horizontal surface. In the present embodiment, the nano particles 120 are spaced apart from each other, which prevents or inhibits the inclination angle from being reduced as the number of deposited layers increases.

The photonic crystal structure 100 of the above-described structure has a relatively low color variation according to viewing angle when light $L_C$ of a wavelength band is determined according to materials, thicknesses, and the number of deposited layers of the first material layer 141 and the second material layer 142 is reflected. Thus, a wide viewing angle is realized.

Figure 2:
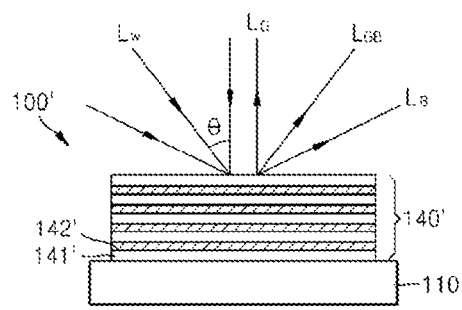
FIG. 2 is a schematic cross-sectional view of a general one-dimensional photonic crystal structure in which a color shift occurs according to an incident angle.

FIG. 2 is a schematic cross-sectional view of a general one-dimensional photonic crystal structure 100' in which a color shift occurs according to an incident angle. When a photonic crystal layer 140' in which a first refractive index layer 141' and a second refractive index layer 142' are alternately deposited is formed on a substrate 110' and has a planar structure, the photonic crystal layer 140' reflects light of a wavelength band configured for perpendicularly incident light. For example, when materials and thicknesses of the first refractive index layer 141' and the second refractive index layer 142' are configured in such a way that the photonic crystal layer 140' reflects the light $L_G$ of a green wavelength band, only if white light $L_W$ is incident in a perpendicular direction, the light $L_G$ of the green wavelength band is reflected. However, if the white light $L_W$ is incident at a particular (or, alternatively a predetermined) angle θ, the light $L_C$ of the green wavelength band is shifted to the light $L_C$ of a blue wavelength band according to the angle θ, and thus, light $L_{GB}$ indicating a mixing color of green and blue and light $L_B$ of the blue wavelength band are reflected.

In the photonic crystal structure 100 of FIG. 1, in the white light $L_W$ incident to the photonic crystal layer 140, the light $L_C$ of a wavelength band configured by the photonic crystal layer 140 is reflected. In this regard, a diffraction interference effect is induced by an inclination angle of the surface 140a of the photonic crystal layer 140 having a height distribution that varies, for example, a random height distribution. That is, light is reflected, diffracted, and scattered at various heights and angles, thereby reducing a color variation according to an angle viewed, and recognizing the light $L_C$ of a wavelength band within an increased viewing angle range.

Figure 3:
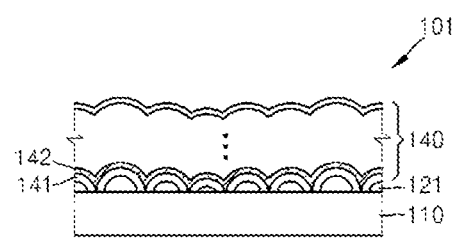
FIG. 3 is a schematic cross-sectional view of a photonic crystal structure according to another example embodiment.

FIG. 3 is a schematic cross-sectional view of a photonic crystal structure 101 according to another example embodiment. The photonic crystal structure 101 of the present embodiment in which a plurality of nano particles 121 have hemispherical shapes is different from the photonic crystal structure 100 of FIG. 1. The nano particles 121 may have various shapes of conical, truncated conical, or polygonal shapes.

Figure 4A:
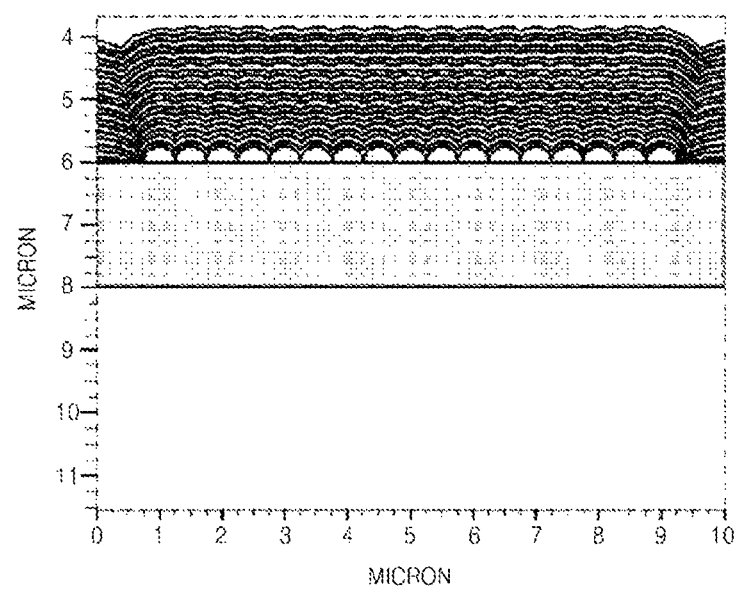
FIGS. 4A and 4B are simulation diagrams for comparing an inclination angle of a surface of a photonic crystal layer according to whether a plurality of nano particles are spaced apart from each other.
Figure 4B:
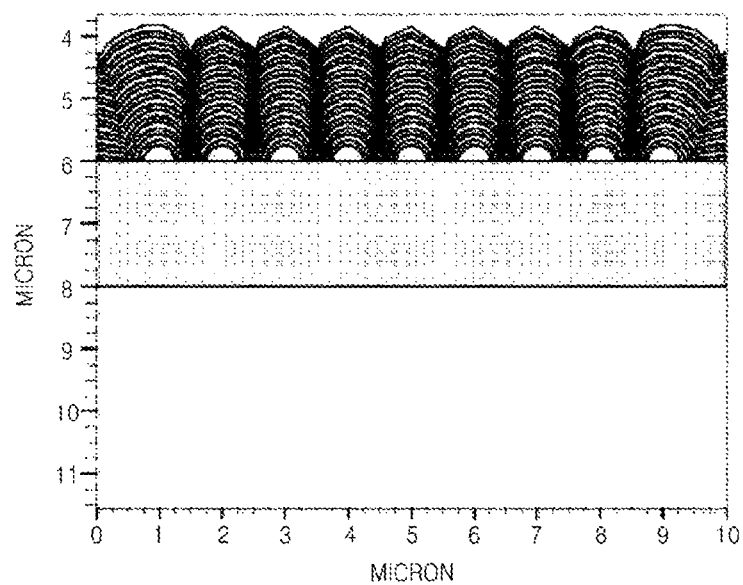

FIGS. 4A and 4B are simulation diagrams for comparing an inclination angle of a surface of a photonic crystal layer according to whether a plurality of nano particles are spaced apart from each other.

Referring to FIGS. 4A and 4B, the inclination angle of the surface of the photonic crystal layer of FIG. 4A when the nano particles are spaced apart from each other is greater than the inclination angle of the surface of the photonic crystal layer of FIG. 4B when the nano particles are not spaced apart from each other. Although nano particles of hemispherical shapes having uniform sizes are simulated for convenience of description, nano particles of different shapes having various sizes, for example, random sizes, may have a similar result to that of the nano particles of hemispherical shapes having uniform sizes.

Figure 5:
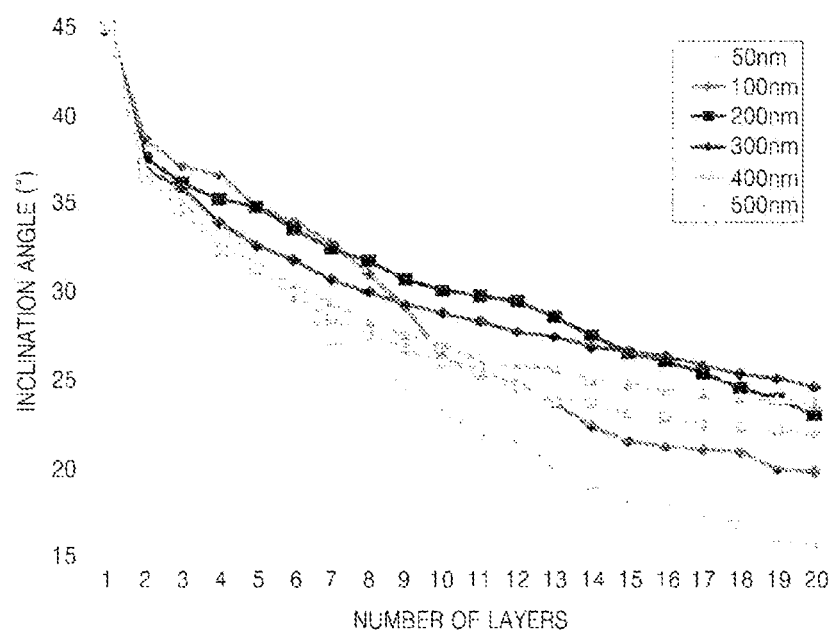
FIG. 5 is a simulation graph of an inclination angle of a surface of a photonic crystal layer according to spaces between a plurality of nano particles and the number of layers included in the photonic crystal layer.

FIG. 5 is a simulation graph of an inclination angle of a surface of a photonic crystal layer according to spaces between a plurality of nano particles and the number of layers included in the photonic crystal layer.

The higher the number of deposited layers of a first material layer and a second material layer included in the photonic crystal layer, the higher the reflection efficiency. In this regard, the higher the number of deposited layers, the more planar the surface of the photonic crystal layer. That is, when the number of deposited layers of the photonic crystal layer increases based on the reflection efficiency, a viewing angle is relatively reduced. However, when the nano particles are spaced apart from each other by an appropriate distance, an inclination angle of the surface of the photonic crystal layer may be prevented or inhibited from being reduced as the number of deposited layers increases, and an appropriate viewing angle may be secured.

FIGS. 6A through 6D are cross-sectional views for explaining a method of manufacturing a photonic crystal structure according to an example embodiment. FIG. 7 is a simulation graph of an inclination angle of a surface of a photonic crystal layer 240 according to whether a sputterer or evaporator is used and the number of layers included in the photonic crystal layer when the photonic crystal layer is formed.

The method of manufacturing the photonic crystal structure of the present embodiment includes forming a nano structure layer in which a plurality of nano particles having various sizes, for example, random sizes, are spaced apart from each other, and forming a photonic crystal layer having a non-planar surface and configured to reflect light of a particular (or, alternatively a predetermined) wavelength on the nano structure layer.

The detailed operations will now be described below.

Figure 6A:
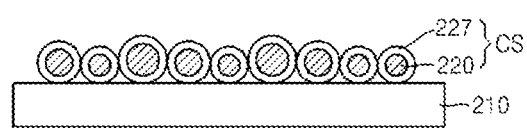
FIGS. 6A through 6D are cross-sectional views for explaining a method of manufacturing a photonic crystal structure according to an example embodiment.
Figure 7:
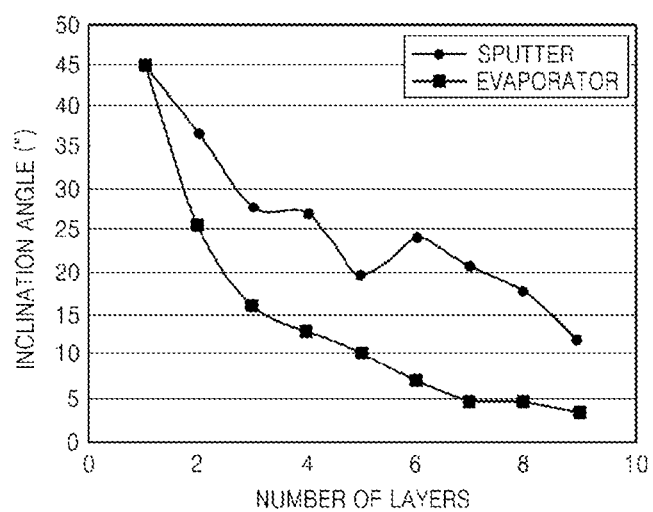
FIG. 7 is a simulation graph of an inclination angle of a surface of a photonic crystal layer according to whether a sputterer or evaporator is used and the number of layers included in the photonic crystal layer when the photonic crystal layer is formed.

Referring to FIG. 6A, a plurality of core-shell type particles (CS) are formed on a substrate 210. The core-shell type particles (CS) have various sizes, for example, random sizes, and include cores 220 and shells 227 that are formed of different materials. For example, the cores 220 are formed of inorganic materials, and the shells 227 are formed of organic materials, for example, materials that may be reflowed by heat. The core-shell type particles (CS) may have a monolayer structure. Such a three-dimensional (3D) various structure, for example, random structure is implemented by forming, for example, a suspension in which the core-shell type particles (CS) are dispersed as a monolayer by using evaporation. In this regard, the monolayer is spontaneously formed by a capillary force generated by evaporation of a solvent, and generally has a FCC structure or a HCP structure.

Figure 6B:
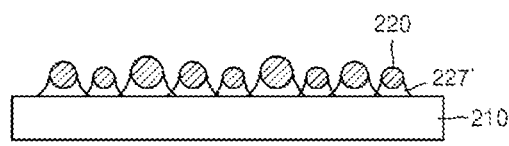

Referring to FIG. 6B, a reflow layer 227' is formed by reflowing materials of the shells 227 through a baking process so that materials of the cores 220 of the core-shell type particles (CS) are exposed.

Figure 6C:
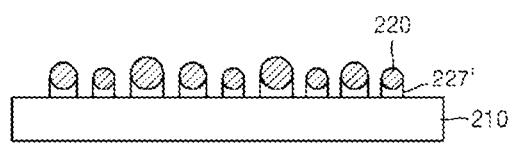

Referring to FIG. 6C, portions of the reflow layer 227' between the cores 220 are etched, and thus spaces between the cores 220 are formed.

Figure 6D:
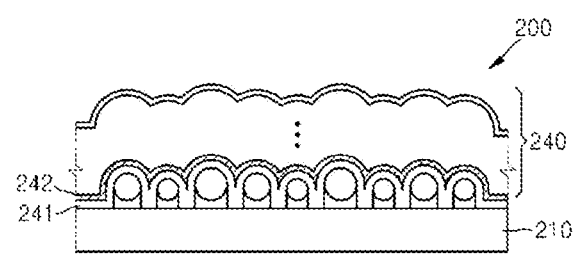

Referring to FIG. 6D, the photonic crystal layer 240 is formed by alternately depositing a first material layer 241 having a first refractive index and a second material layer 242 having a second refractive index different from the first refractive index. Materials, thicknesses, and number of layers of the first material layer 241 and the second material layer 242 may be determined according to a reflection wavelength band and reflection efficiency. For example, the first material layer 241 and the second material layer 242 may be formed of any one selected from the group consisting of $SiO_2$, $TiO_2$, $Si_3N_4$, $CaF_2$, LiF, or $MgF_2$. One of the first material layer 241 and the second material layer 242 may be formed of an insulating material, and the other one may be formed of a metal material.

The first material layer 241 and the second material layer 242 may be formed by using the sputterer or the evaporator. However, when the first material layer 241 and the second material layer 242 are formed by using the sputterer, a reduction in the inclination angle of the surface of the photonic crystal layer 240 decreases according to the number of layers. The sputter deposition conditions may be a maximum mean free path and a minimum distance between a target and the substrate 210 in order to maintain the inclination angle of the surface of the photonic crystal layer 240 as large as possible. The mean free path is a mean of a distance before target particles toward the substrate 210 collide. In general, the larger the mean free path, the lower the pressure in the sputterer. In this regard, the maximum and the minimum are within a range provided by sputter equipment. For example, the mean free path is about 10 cm or more. A distance between the target and the substrate 210 may be about 10 cm or less.

A photonic crystal structure 200 including the photonic crystal layer 240 having a height that varies, for example, a random height, is manufactured through the operations described above.

Figure 8:
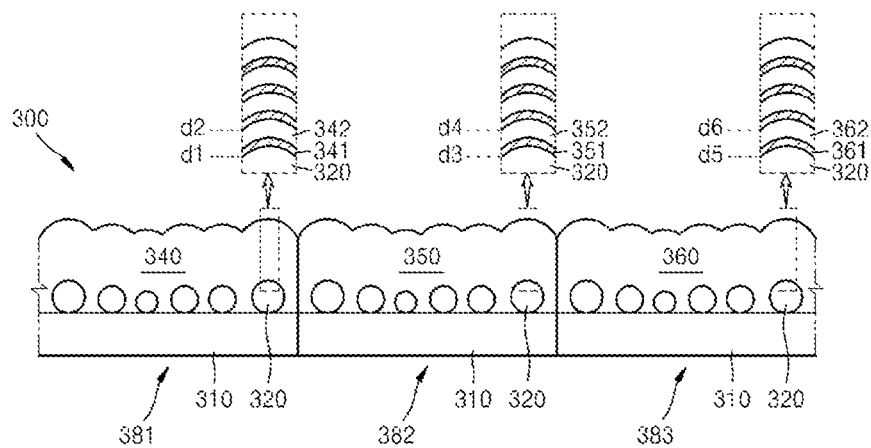
FIG. 8 is a schematic cross-sectional view of a reflective color filter according to an example embodiment.

FIG. 8 is a schematic cross-sectional view of a reflective color filter 300 according to an example embodiment. Referring to FIG. 8, the reflective color filter 300 includes a first color unit 381 that selectively reflects light of a first wavelength, a second color unit 382 that selectively reflects light of a second wavelength, and a third color unit 383 that selectively reflects light of a third wavelength. Although the reflective color filter 300 includes one first color unit 381, one second color unit 382, and one third color unit 383 for convenience of description, the reflective color filter 300 includes a plurality of first color units 381, a plurality of second color units 382, and a plurality of third color units 383, which are alternately arranged in a 2D array.

The first color unit 381, the second color unit 382, and the third color unit 383 may employ the photonic crystal structures 100, 101, and 200 described above. That is, the first color unit 381, the second color unit 382, and the third color unit 383 may include a plurality of nano particles 320 spaced apart from each other on a substrate 310. Photonic crystal layers 340, 350, and 360 having non-planar surfaces are disposed on the nano particles 320 and reflect the first wavelength, the second wavelength, and the third wavelength, respectively.

For example, the photonic crystal layer 340 includes a first material layer 341 and a second material layer 342 having thicknesses d1 and d2, respectively, to reflect the light of the first wavelength, the photonic crystal layer 350 includes a first material layer 351 and a second material layer 352 having thicknesses d3 and d4, respectively, to reflect the light of the second wavelength, and the photonic crystal layer 360 includes a first material layer 361 and a second material layer 362 having thicknesses d5 and d6, respectively, to reflect the light of the third wavelength. The light of the first wavelength, the light of the second wavelength, and the light of the third wavelength may be, for example, red light, green light, and blue light, respectively.

Figure 9:
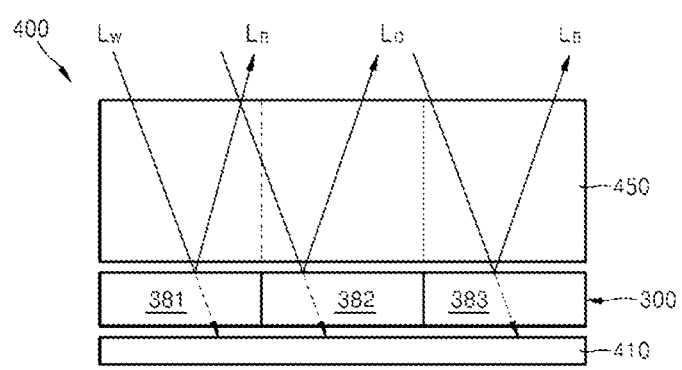
FIG. 9 is a schematic cross-sectional view of a display apparatus according to an example embodiment.

FIG. 9 is a schematic cross-sectional view of a display apparatus 400 according to an example embodiment. Referring to FIG. 9, the display apparatus 400 includes the reflective color filter 300 including the first color unit 381, the second color unit 382, and the third color unit 383, and a display panel 450 having regions corresponding to the first color unit 381, the second color unit 382, and the third color unit 383, and modulating light incident to the regions according to image information.

The display panel 450 may employ various structures so as to function as a light shutter for controlling incident light to be on/off or a transmissivity of the incident light, and may include, for example, a liquid crystal display device, an electrophoresis display device, an electrowetting display device, or an electrochromic display device.

The display apparatus 400 may further include an absorption unit 410 that absorbs light of a wavelength band that is not reflected in the reflective color filter 300, i.e. light passing through the reflective color filter 300.

The white light $L_W$ incident into the reflective color filter 300 is reflected as the red light $L_R$, the green light $L_G$, and the blue light $L_B$ in the first color unit 381, the second color unit 382, and the third color unit 383, respectively. The reflected red light $L_R$, the green light $L_G$, and the blue light $L_B$ are modulated in the regions of the display panel 450 according to the image information, and thus, an image is formed.

The photonic crystal structure described above exhibits a color filtering performance having a wide viewing angle, and thus, the reflective color filter and the display apparatus employing the photonic crystal structure may provide an image having higher light efficiency, easier color formation, and a wider viewing angle.

Furthermore, the method of manufacturing the photonic crystal structure described above may maintain a non-planar surface even after a photonic crystal layer of a multilayer structure is formed on a plurality of nano particles having various sizes, for example, random sizes.

It should be understood that the optical filter, the reflective color filter, the display apparatus, and the method of manufacturing the reflective color filter according to example embodiments described herein should be considered in a descriptive sense only and not for purposes of limitation. Descriptions of features or aspects within each example embodiment should typically be considered as available for other similar features or aspects in other example embodiments.

What is claimed is:

1. A photonic crystal structure comprising:
   a nano structure layer including a plurality of nano particles of various heights, the plurality of nano particles spaced apart from each other; and
   a photonic crystal layer on the nano structure layer, the photonic crystal layer having a non-planar surface and configured to reflect light having a particular wavelength,
   wherein at least one of the plurality of nano particles is a core shell type particle including a core and a shell, and at least a portion of the shell is removed exposing at least a portion of the core, the core being embedded in a remaining portion of the shell.

2. A method of manufacturing a photonic crystal structure, the method comprising:
   forming a nano structure layer on a substrate, the nano structure layer including a plurality of nano particles of various sizes spaced apart from each other; and
   forming a photonic crystal layer on the nano structure layer, the photonic crystal layer having a non-planar surface and configured to reflect light having a particular wavelength,
   wherein the forming a nano structure layer includes,
      forming a plurality of core-shell type particles on the substrate, each core-shell type particle including a core and a shell,
      reflowing materials of portions of the plurality of core-shell type particles, the portions corresponding to the shells of the plurality of core-shell type particles, the core being embedded in a remaining portion of the shell in each core-shell type particle, and
      etching the reflowed materials of the shells.

3. The method of claim 2, wherein the forming a plurality of core-shell type particles forms the plurality of core-shell type particles in a monolayer structure.

4. The method of claim 2, wherein the cores of the plurality of core-shell type particles are formed of inorganic materials, and the shells of the plurality of core-shell type particles are formed of organic materials.

5. The method of claim 2, wherein the forming a photonic crystal layer includes alternately depositing a first material layer and a second material layer, the first material layer having a first refractive index and the second material layer having a second refractive index different from the first refractive index.

6. The method of claim 5, wherein the alternately depositing a first material layer and a second material layer includes a deposition process using a sputter.

7. The method of claim 6, wherein sputter deposition conditions include a mean of a distance before target particles collide of about 10 cm or more, and a distance between a target and the substrate of about 10 cm or less.

* * * * *